United States Patent [19]
Coyle et al.

[11] Patent Number: 5,795,384
[45] Date of Patent: Aug. 18, 1998

[54] MANUFACTURE OF TRANSITION METAL CARBIDE NITRIDE OR CARBONITRIDE WHISKERS

[75] Inventors: Roy Tom Coyle, Yorba Linda, Calif.; Jan Magnus Ekelund, Jarna, Sweden

[73] Assignees: Sandvik AB, Sandviken, Sweden; Advanced Industrial Materials, Yorba Linda, Calif.

[21] Appl. No.: 504,779

[22] Filed: Jul. 20, 1995

[51] Int. Cl.$^6$ ............................................. C30B 29/62
[52] U.S. Cl. .................. 117/87; 117/75; 117/921
[58] Field of Search .................. 117/75, 76, 87, 117/921, 952, 954

[56] References Cited

U.S. PATENT DOCUMENTS

| | | | |
|---|---|---|---|
| 3,754,076 | 8/1973 | Cutler | 423/345 |
| 4,248,844 | 2/1981 | Ramsey, Jr. et al. | 423/345 |
| 4,283,375 | 8/1981 | Horne, Jr. et al. | 423/345 |
| 4,284,612 | 8/1981 | Horne, Jr. et al. | 423/345 |
| 4,883,559 | 11/1989 | Bamberger | 117/75 |
| 4,888,084 | 12/1989 | Nixdorf et al. | 117/75 |
| 5,094,711 | 3/1992 | Narasimhan et al. | 117/87 |
| 5,160,574 | 11/1992 | Pearson et al. | 117/75 |
| 5,221,526 | 6/1993 | Qi et al. | 423/345 |
| 5,256,243 | 10/1993 | Kida | 117/75 |
| 5,383,421 | 1/1995 | Dunmead et al. | 117/921 |
| 5,404,836 | 4/1995 | Milewski | 117/87 |

*Primary Examiner*—Felisa Garrett
*Attorney, Agent, or Firm*—Burns, Doane, Swecker & Mathis, L.L.P.

[57] ABSTRACT

The presently claimed invention relates to a method of producing, in large volumes and at low cost, transition metal carbide, nitride or carbonitride whiskers, preferably submicron, having excellent reinforcing properties. These whiskers are suitable for use as a reinforcement in a wide range of materials, including metals, intermetallics, plastics, ceramics and metallic bonded hard material. The basic idea is the use of a carbon source with a volatile part which volatiles at temperatures up to 1000° C. Transition metal oxide or alkali compounds thereof in amounts to satisfy the stoichiometric requirements of the desired carbide or nitride is mixed with the carbon powder along with an alkali metal chloride powder as a volatilization agent for the metal and a catalyst for the whisker growth such as Ni or Co. The reactant powders are blended in some typical manner using a high speed blender so as to intimately mix them. Finally, the starting material is subjected to nitriding, carbonizing or carbonitriding heat treatments in order to produce the desired whiskers.

10 Claims, 1 Drawing Sheet

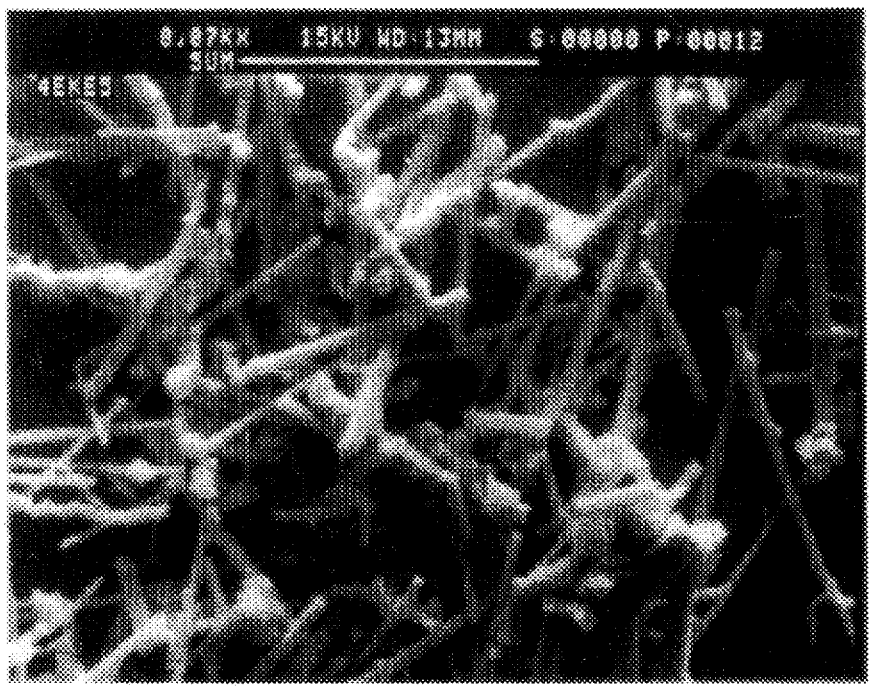
FIG._1
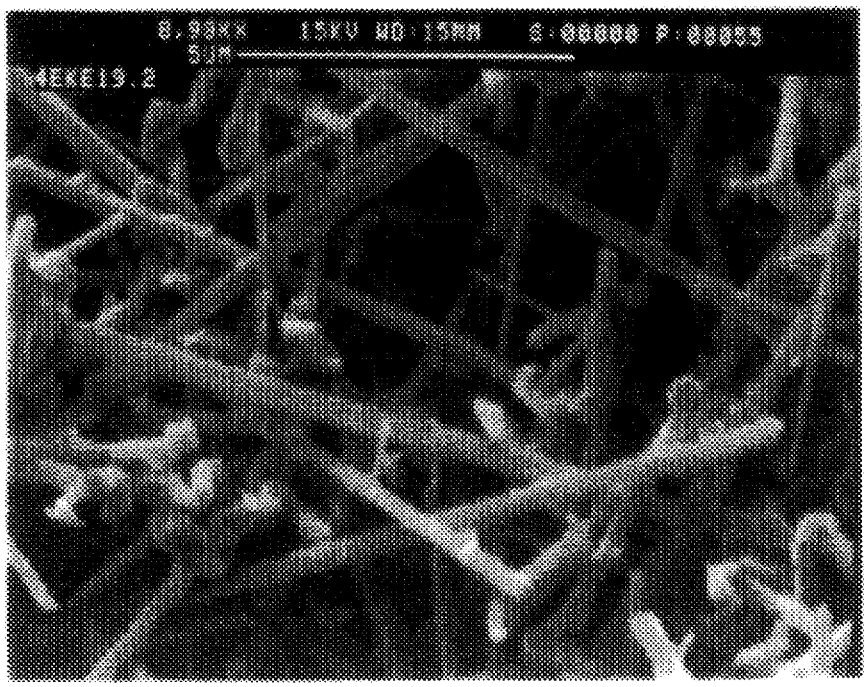
FIG._2

MANUFACTURE OF TRANSITION METAL CARBIDE NITRIDE OR CARBONITRIDE WHISKERS

BACKGROUND OF THE INVENTION

The presently claimed invention relates to a method of producing, in large volumes and at low cost, transition metal carbide, nitride or carbonitride whiskers, generally of submicron size, having excellent reinforcing properties. These whiskers are suitable for the reinforcement of ceramic cutting tools and also in other materials, including metals, intermetallics, plastics and metallic bonded hard material.

During the last decades, great progress has been made in the development of high-performance materials. One of the important reasons to this progress has been the production of inorganic or ceramic whiskers which have high tensile strength and modulus values as well as resistance to high temperatures. The incorporation of these whiskers into advanced ceramics, metals and polymers has produced composites with superior properties.

Discontinuous submicron ceramic fibers can be produced by several methods and in these cases they are most often in the form of single-crystals or so-called "whiskers". Several types of ceramic whiskers (oxides, nitrides, carbides and borides) exist. For example, SiC-whiskers are well-known as a successful reinforcement in cutting tool materials. Most of the development work has hence been directed toward silicon carbide whiskers (e.g., $Al_2O_3$-matrix/SiC-whiskers composites). Some efforts have, however, also been made to develop other metal carbide-, nitride-, and boride-whiskers particularly of the transition metals Ti, Ta, Nb, etc. Whiskers with submicron diameter have, however, not been easily available which makes most of these whisker materials less interesting as reinforcement in different types of advanced ceramic materials.

Ceramic whiskers available on the market are in most cases very expensive and in the case of most transition metal whiskers, no commercial producer exists.

U.S. Pat. No. 3,754,076 discloses a method of producing silicon carbide whiskers by carbothermal reduction of rice hulls. Rice hulls contain both silica and a significant excess of carbon. When using rice hulls as a raw material the rice hulls and silica therefore are intimately mixed. By heating the raw material, the cellulose gives off gaseous products such as carbon dioxide, carbon monoxide, hydrogen, methane and water vapor. The product contains, besides SiC whiskers and particles, a large amount of excess carbon which has to be removed.

In U.S. Pat. No. 4,248,844, SiC whiskers are produced in a similar process as in U.S. Pat. No. 3,754,076. A part of the rice hulls are, however, ashed in air to remove the carbon and then remixed with a carbonized fraction of rice hulls.

In U.S. Pat. No. 4,283,375, rice hulls are ashed in air to obtain amorphous $SiO_2$ which is blended with fine particle-sized carbon. This process is claimed to give β-SiC whiskers with a good yield.

U.S. Pat. No. 4,284,612 describes a process of preparing SiC whiskers by using chopped carbon or graphite fibers made from partly oxidized organic fibers. The fibers should be about 10 to 100 μm in length. The patent does, however, not give any explanation why fibers give a better whisker yield.

U.S. Pat. No. 5,221,526 uses silica and a particulate carbon source together with a boron component and a seeding component to control the shape and size of the produced SiC-whiskers.

The carbothermal process of producing SiC-whiskers has the general potential to produce large amounts to a low cost if the reaction condition can be properly controlled.

U.S. Pat. No. 4,888,084 discloses a method for the preparation of titanium nitride whiskers by carbothermal reaction of mixtures of $TiO_2$, carbonized organic fibers and a catalyst such as Ni or Co. During the process, a halogen, preferably a chlorine-containing gas, is passed over the mixture. It is thought that the carbon fibers perform three functions: i) provide a high void volume necessary for the whisker growth; ii) act as a reducing agent for the titanium oxide; and iii) act as a nucleation site for the whisker growth.

In U.S. Pat. No. 5,256,243, a process of making TiC whiskers from a mixture of $TiO_2$ or alkali metal compounds thereof, alkali metal chlorides and carbon by carbothermal reduction is described.

U.S. Pat. No. 4,883,559 discloses a process for making transition metal whiskers from a melt of cyanide salt, alkali metal oxides and a transition metal oxide.

U.S. Pat. No. 5,160,574 discloses a process for production of small diameter titanium carbide whiskers by a CVD method.

U.S. Pat. No. 5,094,711 discloses a process for producing single crystal titanium carbide whiskers by Chemical Vapor Deposition (CVD).

In the case of transition metal carbide, nitride or carbonitride whiskers, the carbothermal process has not been as successful as in the case of silicon carbide whisker synthesis. The CVD process works with a well-controlled composition of the gas phase, but the cost is high and the possibility of producing large amounts of submicron whiskers is low.

OBJECTS AND SUMMARY OF THE INVENTION

It is an object of this invention to avoid or alleviate the problems of the prior art.

It is further an object of this invention to provide a method of producing, in large volumes and at low cost, high strength whiskers of the transition metal carbides, nitrides or carbonitrides which are straight, having smooth surfaces and with a diameter less than 5 μm, preferably submicron, having excellent reinforcing properties in advanced materials.

These and other objects are provided by a method of producing in large volumes transition metal carbide, nitride or carbonitride whiskers comprising:

intimately mixing, a carbon powder containing a volatile part which volatiles at temperatures up to 1000° C., a transition metal (oxide, hydroxide and/or alkali oxide) compound in an amount to satisfy the stoichiometric requirements of the desired whisker, at least one of the alkali chlorides NaCl, KCl or CaCl, a transition metal/alkali chloride molar ratio 0.1–2, and Ni and/or Co as a catalyst in a transition metal (Ni+Co) molar ratio 0.01–0.5; and heating the mixture to 1000°–1800° C., for 1–15 hours, at 10 mbar–50 bar pressure in an atmosphere of at least one of Ar, $N_2$ or $H_2$.

BRIEF DESCRIPTION OF THE DRAWINGS

FIGS. 1 and 2 show SEM micrographs of whiskers synthesized according to the presently claimed invention.

DETAILED DESCRIPTION OF THE PREFERRED EMBODIMENTS OF THE INVENTION

According to the presently claimed invention, it has been found that starting mixtures of transition metal oxides or alkali oxide compounds thereof and a carbon powder with a volatile part can be nitrided, carbonitrided or carburized. The transition metals are the metals of Groups IVa and Va of the Periodic Table. In this way, it is possible to synthesize submicron diameter whiskers of carbide, nitride or carbonitride of the transition metals, preferably of Ti, Ta, Hf, Zr and Nb of superior quality, useful as reinforcement in different types of materials, e.g., plastics, metals, intermetallics, metallic bonded hard materials and ceramics.

According to the presently claimed invention, it has been found that by using a carbon powder, with a primary grain size (that is, a majority of the powder) of 10–50 nm, and with a volatile part, between 10 weight % and 30 weight %, which part volatilizes at temperatures up to 1000° C., preferably above 500° C., the porosity of the starting mixture is kept at a high level through the whole reaction. This facilitates the growth of whiskers within the volume of the starting mixture and provides the whisker with an accurate mixture of gas species that are generated from the starting mixture. The porosity also makes it easy for nitrogen to penetrate the reaction mixture in case of synthesizing a nitride whisker. Carbon powder with such a volatile portion is commercially available, for example, from Degussa AG. The carbon source is an oxidized carbon black that has oxygen-containing functional groups like carboxyl and chinon on the surface of the powder which are the volatile portion and which volatize at temperatures up to 1000° C. It may also contain some hydrocarbons. The carbon powder is easily obtainable, either easy to produce in great amounts or commercially available on the market, for example Degussa Color Black FW200 or FW2, Degussa Special Black 6, 5 or 4, which normally are used as black pigment. This way of obtaining a porous reaction mixture can easily be controlled compared to the use of chopped carbon fibers as described in earlier patents.

The reaction mixture contains transition metal oxide or alkali oxide compounds thereof with a grain size of about –325 mesh and preferably a fluffy appearance and the above-mentioned carbon powder, in amounts to satisfy the stoichiometric requirements of the desired compound to be produced (e.g., carbide or nitride). An alkali metal chloride like NaCl, KCl of CaCl of conventional grain size, alone or in combination, in the molar ratio 0.1–2, preferably 0.5–1 (alkali metal chloride/transition metal oxide), is added as a volatilization agent for the transition metal. A 50/50 mixture of microsized salt, about 10 μm in size, and a coarse salt of about 2 mm in size has been found to give a good result. A catalyst for the whisker growth, Ni and/or Co powder of conventional grain size, is added in a catalyst/transition metal oxide molar ratio of 0.01–0.5, preferably 0.02–0.1. The reactant powders are mixed, wet or dry, preferably dry, in some conventional manner using a high speed blender so as to intimately mix them. The bulk density of the reaction mixture should be low so that the mixture shall have a flowing appearance, the surfaces of the powders are accessible to reaction gases and reaction products can be removed. The bulk density for a particular mixture can be readily determined by the skilled artisan.

The reactant mixture is heated in a graphite furnace at 1000°–1800° C., preferably 1100°–1500° C., in an atmosphere containing Ar, $N_2$, $H_2$ or $Cl_2$ or mixtures thereof, with a small (≈50 ml/min), gas flow. The holding time at reaction temperature ranges from 1 to 15 hours and the pressure from 10 mbar to 50 bar, preferably 0.5 to 2 bar.

The mole fraction carbon/transition metal depends on the transition metal oxide and the desired product (nitride, carbide or carbonitride), and preferably has a carbon surplus of 0.2–0.7 mol. Also, depending on the type of transition metal and the type of whiskers to be produced, different synthesis parameters such as temperature and gas phase composition must be chosen.

For the production of nitride-whiskers according to the presently claimed invention, $N_2$-gas is utilized. An oxide of Ta, Nb, Ti, etc., alone or in combination is mixed with the carbon powder with C/metal oxide mole ratio such that a surplus according to the chemical equation is obtained. The overall chemical reaction can be written, e.g. for $Ta_2O_5$:

$$Ta_2O_5(s)+5C(s)+N_2(g) \rightarrow 2TaN(s)+5CO(g)$$

It is essential for this reaction to proceed to the right, that the CO-partial-pressure is held sufficiently low and that nitrogen gas is provided to the interior of the reaction mixture. This means that the nitrogen must penetrate the reaction mixture whose porosity is held at highest possible level using the carbon powder according to the presently claimed invention.

The temperature is held between 1100° and 1500° C. and the pressure in the reaction-zone can be up to 50 bar, preferably 0.5–5 bar.

In this way, high quality whiskers of nitride with low levels (≦1 weight %) of residual free oxygen are obtained. The amount of carbon left depends on the surplus used in the starting mixtures.

If carbon fulfilling the stoichiometric requirements for producing carbide whiskers plus a surplus is used in the starting mixture, the overall chemical reaction can be written, e.g., for $Ta_2O_5$:

$$Ta_2O_5(s)+7C(s) \rightarrow 2TaC(s)+5CO(g)$$

The temperature shall be held between 1200° and 1400° C. in a nitrogen atmosphere for three hours and then the gas is switched to Ar and the temperature raised to 1300°–1500° C. for two hours.

The reason for using nitrogen is that the reaction can take place at a lower temperature compared to Ar atmosphere. The nitrogen that has been incorporated in the structure of the carbide is then replaced with carbon during the annealing in Ar. However, in the titanium system, the nitride is stable at the reaction temperature so in this case, Ar gas is preferred.

If this synthesis route is followed, carbide whiskers of extremely high quality with low level of nitrogen (≦0.2 weight %) and oxygen (≦0.5 weight %) can be produced.

By choosing an intermediate amount of carbon, a nitrogen atmosphere and a temperature in the same range as the carbide synthesis, but no extra holding temperature in Ar, carbonitride whiskers are obtained.

The result of the synthesis according to the presently claimed invention, is a mixture of generally submicron diameter whiskers in an amount between 70 and 80% by volume and very small (≦1 μm diameter) particles of the synthesized product. This high yield makes an extra separation of whiskers and particles plus the residual carbon unnecessary. However, if an even higher yield is desired, a subsequent refinement step can be applied.

The optimal conditions given above, both starting formulation and synthesis parameters, depend on the equipment used for the synthesis and the choice of raw materials. It is within the purview of the skilled artisan using other equipment and other raw materials to determine the optimal conditions by experiments.

The invention is additionally illustrated in connection with the following Examples which are to be considered as illustrative of the present invention. It should be understood, however, that the invention is not limited to the specific details of the Examples.

EXAMPLE 1

$Ta_2O_5$ powder (Cerac, T-1013, −325 mesh) was mixed with carbon powder (Degussa FW200) with mole fraction $C/Ta_2O_5=5.1$, 0.5 mole fractions of $NaCl/Ta_2O_5$ (NaCl, Akzo) and 0.02 mole fractions of $Ni/Ta_2O_5$ (Ni, Cerac, N1023, −325 mesh) were also added. The powders were mixed in a high speed blender and then subjected to a carbothermal nitridation with the following process parameters T=1220° C.
t=5 hours
$p(N_2)$=1 bar The whiskers produced consisted of Ta(N,C) with a lattice parameter of 4.33 Å. The amount of inorganic bound oxygen was less than 1 weight %. The whiskers are straight and of submicron size. FIG. 1.

EXAMPLE 2

Example 1 was repeated with the following synthesis parameters:

$C/Ta_2O_5=7.1$
T=1250° C./1300° C.
t=5 hours and 2 hours
$p(N_2)$ and $p(Ar)$=800 mbar A SEM-micrograph of the resultant TaC whiskers, which were straight with smooth surfaces of submicron size, are shown in FIG. 2. The whiskers were pure TaC with a lattice parameter of 4.45 Å. The amount of inorganic bound oxygen was less than 0.1 weight %.

EXAMPLE 3

NbC whiskers were produced using $Nb_2O_5$(Cerac N-1117, −325 mesh) and with the following synthesis parameters:

$C/Nb_2O_5=7.1$
$Ni/Nb_2O_5=0.02$
$NaCl/Nb_2O_5=0.5$
T=1300° C./1400° C.
t=5 hours and 2 hours
$p(N_2)$ and $p(Ar)$=800 mbar The whiskers were pure NbC with a lattice parameter of 4.47 Å. The amount of inorganic bound oxygen was less than 0.9 weight %. The whiskers had smooth surface morphology and were of submicron size.

EXAMPLE 4

HfC whiskers were produced using $HfO_2$ (Cerac H1012, −325 mesh) and with the following synthesis parameters:

$C/HfO_2=2.05$
$Ni/HfO_2=0.02$
$NaCl/HfO_2=0.5$
T=1400° C./1500° C.
t=5 hours and 2 hours
$p(N_2)$ and $p(Ar)$=600 mbar The whiskers were pure HfC. The amount of inorganic bound oxygen was less than 0.5 weight %. The whiskers had smooth surface morphology and with submicron size.

EXAMPLE 5

For producing TiN whiskers starting from $TiO_2$ (Cerac T1156, −325 mesh) the following synthesis parameters were chosen:

$C/TiO_2=2.05$
$Ni/TiO_2=0.02$
$NaCl/TiO_2=0.5$
T=1400° C.
t=5 hours
$p(N_2)$=1 bar The whiskers were pure TiN. The amount free carbon was less than 0.4 weight % and the amount of inorganic bound oxygen was less than 0.5 weight %. The whiskers had smooth surface morphology and with submicron size.

EXAMPLE 6

For producing TiC whiskers starting from $TiO_2$ (Cerac T1156, −325 mesh) the following synthesis parameters were chosen:

$C/TiO_2=3.1$
$Ni/TiO_2=0.02$
$NaCl/TiO_2=0.5$
T=1450° C./1500° C.
t=5 hours and 2 hours
$p(Ar)$ =800 mbar The whiskers were pure TiC. The amount of inorganic bound oxygen was less than 0.5 weight %. The whiskers had smooth surface morphology and with submicron size.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of producing in large volumes of transition metal carbide, nitride or carbonitride whiskers comprising:

mixing a carbon powder containing a volatile part which volatiles at temperatures up to 1000° C., a transition metal compound in an amount to satisfy the stoichiometric requirements of the whisker to be formed, at least one of the alkali chlorides NaCl, KCl or CaCl, a transition metal/alkali chloride molar ratio 0.1–2, and a catalyst of Ni, Co and mixtures thereof in a transition metal (Ni+Co) molar ratio 0.01–0.5; and heating the mixture to 1000°–1800° C., for 1–15 hours at 10 mbar–50 mbar pressure in an atmosphere of at least one of Ar, $N_2$ of $H_2$.

2. The method of claim 1 wherein the atmosphere is $N_2$.

3. The method of claim 1 wherein the atmosphere is Ar.

4. The method of claim 1 wherein the transition metal compound is selected from the group consisting of an oxide, hydroxide, alkali oxide transition metal compound and mixtures thereof.

5. The method of claim 1 wherein the atmosphere is $H_2$.

6. The method of claim 1 wherein the carbon powder has a primary grain size of 10–50 nm.

7. The method of claim 1 wherein the volatile part of the carbon powder is from 10–30 weight % of the carbon powder.

8. The method of claim 1 wherein the mixture is heated to a temperature of 1100°–1500° C.

9. The method of claim 1 wherein the atmosphere also contains $Cl_2$.

10. The method of claim 1 wherein the mixture contains carbon in an amount of from 0.2–0.7 mol. in excess of that necessary to form the whisker.

* * * * *